(12) United States Patent
Kato

(10) Patent No.: US 11,315,767 B2
(45) Date of Patent: Apr. 26, 2022

(54) PLASMA PROCESSING APPARATUS

(71) Applicant: TOYOTA JIDOSHA KABUSHIKI KAISHA, Toyota (JP)

(72) Inventor: Noriyuki Kato, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 21 days.

(21) Appl. No.: 16/058,362

(22) Filed: Aug. 8, 2018

(65) Prior Publication Data

US 2019/0096640 A1 Mar. 28, 2019

(30) Foreign Application Priority Data

Sep. 25, 2017 (JP) .............................. JP2017-183356

(51) Int. Cl.
*H01J 37/32* (2006.01)
*C23C 16/04* (2006.01)
(Continued)

(52) U.S. Cl.
CPC ...... *H01J 37/32715* (2013.01); *C23C 16/042* (2013.01); *C23C 16/4585* (2013.01);
(Continued)

(58) Field of Classification Search
CPC ........... H01J 37/32715; H01J 37/32458; H01J 2237/3321; H01J 2237/004;
(Continued)

(56) References Cited

U.S. PATENT DOCUMENTS 4,369,730 A  1/1983 Izu et al.
4,379,181 A  4/1983 Cannella et al.
(Continued)

FOREIGN PATENT DOCUMENTS

CZ  2016603 A3  10/2017
JP  H06-000459 Y2  1/1994
(Continued)

OTHER PUBLICATIONS

U.S. Appl. No. 15/491,350, filed Apr. 19, 2017.
(Continued)

*Primary Examiner* — Ram N Kackar
(74) *Attorney, Agent, or Firm* — Hunton Andrews Kurth LLP

(57) ABSTRACT

A plasma processing apparatus configured to perform plasma processing on a conductive workpiece having a flat plate shape includes: a conductive vacuum chamber having a recessed portion which is configured to cause a processing object portion of at least one side of the workpiece having a flat plate shape to be disposed in the recessed portion and a peripheral edge portion which is provided outside the recessed portion to be continuous with the recessed portion; a holding member configured to hold the workpiece to be separated and insulated from the peripheral edge portion; a voltage application unit configured to apply a voltage between the workpiece and the vacuum chamber; and an insulating layer configured to cover a portion of the peripheral edge portion facing the workpiece.

7 Claims, 8 Drawing Sheets

(51) Int. Cl.
   *C23C 16/458*  (2006.01)
   *C23C 16/509*  (2006.01)
   *C23C 16/50*   (2006.01)
   *C23F 4/00*    (2006.01)

(52) U.S. Cl.
   CPC ............ *C23C 16/50* (2013.01); *C23C 16/509* (2013.01); *H01J 37/32458* (2013.01); *C23F 4/00* (2013.01); *H01J 2237/004* (2013.01); *H01J 2237/3321* (2013.01)

(58) Field of Classification Search
   CPC ........... H01J 37/32807; H01J 37/32513; H01J 37/32724; H01J 37/32431; C23C 16/509; C23C 16/4585; C23C 16/042; C23C 16/50; C23F 4/00
   See application file for complete search history.

(56) References Cited

U.S. PATENT DOCUMENTS

| | | | |
|---|---|---|---|
| 4,389,970 A | 6/1983 | Edgerton | |
| 4,475,223 A | 10/1984 | Taniguchi et al. | |
| 4,542,711 A | 9/1985 | Izu et al. | |
| 4,609,566 A | 9/1986 | Hongo et al. | |
| 4,718,340 A | 1/1988 | Love, III | |
| 4,915,057 A | 4/1990 | Boudreau et al. | |
| 4,920,917 A | 5/1990 | Nakatani et al. | |
| 5,063,951 A | 11/1991 | Bard et al. | |
| 5,354,413 A * | 10/1994 | Smesny | H01J 37/32009 156/345.47 |
| 5,423,971 A | 6/1995 | Arnold et al. | |
| 5,705,019 A | 1/1998 | Yamada et al. | |
| 5,733,511 A | 3/1998 | De Francesco | |
| 6,004,617 A | 12/1999 | Schultz et al. | |
| 6,022,462 A | 2/2000 | Ikeda et al. | |
| 6,162,323 A | 12/2000 | Koshimizu | |
| 6,432,577 B1 | 8/2002 | Shul et al. | |
| 7,098,045 B2 * | 8/2006 | Noji | B08B 3/04 118/733 |
| 7,649,159 B2 | 1/2010 | Matsuura et al. | |
| 7,737,035 B1 | 6/2010 | Lind et al. | |
| 7,993,457 B1 | 8/2011 | Krotov et al. | |
| 9,515,633 B1 | 12/2016 | Long et al. | |
| 9,581,741 B1 | 2/2017 | Berland et al. | |
| 10,385,455 B2 | 8/2019 | Iizuka | |
| 10,597,775 B2 | 3/2020 | Iizuka | |
| 2001/0009139 A1 | 7/2001 | Shan et al. | |
| 2001/0050057 A1 | 12/2001 | Yonezawa et al. | |
| 2001/0055823 A1 | 12/2001 | Tran et al. | |
| 2002/0012266 A1 | 1/2002 | Gogl et al. | |
| 2002/0029791 A1 | 3/2002 | Matsuoka | |
| 2002/0052668 A1 | 5/2002 | Nishiumi et al. | |
| 2002/0088399 A1 | 7/2002 | Noji et al. | |
| 2002/0096258 A1 | 7/2002 | Savas et al. | |
| 2002/0139302 A1 | 10/2002 | Nagashima | |
| 2002/0170676 A1 | 11/2002 | Mitrovic et al. | |
| 2002/0193034 A1 | 12/2002 | Ota | |
| 2003/0038112 A1 | 2/2003 | Liu et al. | |
| 2003/0103877 A1 | 6/2003 | Long | |
| 2003/0137250 A1 | 7/2003 | Mitrovic | |
| 2003/0137251 A1 | 7/2003 | Mitrovic et al. | |
| 2003/0168009 A1 | 9/2003 | Denes et al. | |
| 2003/0196604 A1 | 10/2003 | Sidhwa | |
| 2004/0007326 A1 | 1/2004 | Roche et al. | |
| 2004/0020435 A1 | 2/2004 | Tsuchiya et al. | |
| 2004/0029339 A1 | 2/2004 | Yamamoto et al. | |
| 2004/0083975 A1 | 5/2004 | Tong et al. | |
| 2004/0142558 A1 | 7/2004 | Granneman | |
| 2004/0159287 A1 | 8/2004 | Hoffman et al. | |
| 2004/0163766 A1 | 8/2004 | Kanarov et al. | |
| 2004/0168770 A1 | 9/2004 | Mitrovic et al. | |
| 2004/0238488 A1 | 12/2004 | Choi et al. | |
| 2005/0039682 A1 | 2/2005 | Dhindsa et al. | |
| 2005/0082007 A1 | 4/2005 | Nguyen et al. | |
| 2005/0095873 A1 | 5/2005 | Granneman et al. | |
| 2005/0133166 A1 | 6/2005 | Satitpunwaycha et al. | |
| 2005/0173067 A1 | 8/2005 | Lim | |
| 2005/0178401 A1 | 8/2005 | Boyers | |
| 2005/0178505 A1 | 8/2005 | Kim | |
| 2005/0211167 A1 | 9/2005 | Gunji et al. | |
| 2005/0263484 A1 | 12/2005 | Park et al. | |
| 2006/0008676 A1 | 1/2006 | Ebata et al. | |
| 2006/0051602 A1 | 3/2006 | Iacovangelo et al. | |
| 2006/0086321 A1 | 4/2006 | Brody et al. | |
| 2006/0165994 A1 | 7/2006 | Dalakos et al. | |
| 2006/0232471 A1 | 10/2006 | Coumou | |
| 2007/0031600 A1 | 2/2007 | Devitt | |
| 2007/0034228 A1 | 2/2007 | Devitt | |
| 2007/0068900 A1 | 3/2007 | Kim et al. | |
| 2007/0074664 A1 | 4/2007 | Nishimura et al. | |
| 2007/0284045 A1 | 12/2007 | Fischer et al. | |
| 2007/0292632 A1 | 12/2007 | Yoshida | |
| 2008/0083710 A1 | 4/2008 | Chen et al. | |
| 2008/0121526 A1 | 5/2008 | Hsiao et al. | |
| 2008/0122369 A1 | 5/2008 | Nitschke | |
| 2008/0179010 A1 | 7/2008 | Bailey, III et al. | |
| 2008/0182412 A1 | 7/2008 | Bailey, III et al. | |
| 2008/0227301 A1 | 9/2008 | Fang et al. | |
| 2008/0260938 A1 | 10/2008 | Ikeda et al. | |
| 2008/0286489 A1 | 11/2008 | Wang et al. | |
| 2009/0042085 A1 | 2/2009 | Watanabe et al. | |
| 2009/0166326 A1 | 7/2009 | Sexton et al. | |
| 2009/0183683 A1 | 7/2009 | Kobayashi et al. | |
| 2009/0194026 A1 | 8/2009 | Burrows et al. | |
| 2009/0202734 A1 | 8/2009 | Dhindsa | |
| 2009/0206057 A1 | 8/2009 | Huang et al. | |
| 2009/0314962 A1 | 12/2009 | Dorai et al. | |
| 2010/0000684 A1 * | 1/2010 | Choi | H01J 37/32568 156/345.43 |
| 2010/0003824 A1 | 1/2010 | Kadkhodayan et al. | |
| 2010/0068887 A1 | 3/2010 | Harrington | |
| 2010/0075506 A1 | 3/2010 | Ochi | |
| 2010/0123502 A1 | 5/2010 | Bhutta et al. | |
| 2010/0151686 A1 | 6/2010 | Fang et al. | |
| 2010/0159703 A1 | 6/2010 | Fischer et al. | |
| 2010/0173074 A1 | 7/2010 | Juarez et al. | |
| 2010/0189924 A1 | 7/2010 | D'Evelyn et al. | |
| 2010/0194195 A1 | 8/2010 | Coumou et al. | |
| 2010/0202860 A1 | 8/2010 | Reed et al. | |
| 2010/0221426 A1 | 9/2010 | Sferlazzo | |
| 2010/0230086 A1 | 9/2010 | Tsuzuki et al. | |
| 2010/0255196 A1 | 10/2010 | Geisler et al. | |
| 2010/0296253 A1 | 11/2010 | Miyamoto et al. | |
| 2010/0327927 A1 | 12/2010 | Nagarkatti et al. | |
| 2011/0005681 A1 | 1/2011 | Savas et al. | |
| 2011/0005682 A1 | 1/2011 | Savas et al. | |
| 2011/0006040 A1 | 1/2011 | Savas et al. | |
| 2011/0068087 A1 | 3/2011 | Iwasaki et al. | |
| 2011/0068371 A1 | 3/2011 | Oka | |
| 2011/0076848 A1 | 3/2011 | Datta et al. | |
| 2011/0094994 A1 | 4/2011 | Todorow et al. | |
| 2011/0097901 A1 | 4/2011 | Banna et al. | |
| 2011/0135842 A1 | 6/2011 | Faguet et al. | |
| 2011/0143019 A1 | 6/2011 | Mosso et al. | |
| 2011/0155322 A1 | 6/2011 | Himori et al. | |
| 2011/0159200 A1 * | 6/2011 | Kogure | H01L 21/68735 427/458 |
| 2011/0200741 A1 | 8/2011 | Fukao et al. | |
| 2011/0212625 A1 | 9/2011 | Toyoda et al. | |
| 2011/0226728 A1 | 9/2011 | Blom et al. | |
| 2011/0241773 A1 | 10/2011 | Fisk et al. | |
| 2011/0275219 A1 | 11/2011 | Fang et al. | |
| 2011/0305836 A1 | 12/2011 | Murata et al. | |
| 2012/0003396 A1 | 1/2012 | Maas et al. | |
| 2012/0097641 A1 | 4/2012 | Beckmann et al. | |
| 2012/0097666 A1 | 4/2012 | Pohl et al. | |
| 2012/0128895 A1 | 5/2012 | Ota | |
| 2012/0148738 A1 | 6/2012 | Ikejiri | |
| 2012/0161405 A1 | 6/2012 | Mohn et al. | |
| 2012/0183887 A1 | 7/2012 | Iseki et al. | |
| 2012/0186521 A1 | 7/2012 | Iwasaki et al. | |
| 2012/0196050 A1 | 8/2012 | Vermeer et al. | |
| 2012/0231374 A1 | 9/2012 | Iseki et al. | |

(56) References Cited

U.S. PATENT DOCUMENTS

| | | |
|---|---|---|
| 2012/0262064 A1 | 10/2012 | Nagarkatti et al. |
| 2012/0289054 A1 | 11/2012 | Holland et al. |
| 2013/0012029 A1 | 1/2013 | Vermeer et al. |
| 2013/0115780 A1 | 5/2013 | Okumura et al. |
| 2013/0126476 A1 | 5/2013 | Marakhtanov et al. |
| 2013/0126486 A1 | 5/2013 | Bise et al. |
| 2013/0126513 A1 | 5/2013 | Marakhtanov et al. |
| 2013/0130107 A1 | 5/2013 | Uchida |
| 2013/0149075 A1 | 6/2013 | Shah et al. |
| 2013/0153536 A1 | 6/2013 | Shao et al. |
| 2013/0176691 A1 | 7/2013 | Stevens et al. |
| 2013/0233491 A1 | 9/2013 | Choi |
| 2013/0276978 A1 | 10/2013 | Bluck et al. |
| 2013/0284370 A1 | 10/2013 | Collins et al. |
| 2013/0287526 A1 | 10/2013 | Bluck et al. |
| 2013/0337657 A1 | 12/2013 | Savas et al. |
| 2014/0000843 A1 | 1/2014 | Dunn et al. |
| 2014/0030445 A1 | 1/2014 | Vermeer et al. |
| 2014/0037847 A1 | 2/2014 | Vermeer et al. |
| 2014/0037853 A1 | 2/2014 | Lee |
| 2014/0044887 A1 | 2/2014 | Vermeer |
| 2014/0175055 A1 | 6/2014 | Sasagawa |
| 2014/0199788 A1 | 7/2014 | Vermont et al. |
| 2014/0205068 A1 | 7/2014 | Mashita et al. |
| 2014/0220244 A1 | 8/2014 | Mane et al. |
| 2014/0262746 A1 | 9/2014 | Chen et al. |
| 2015/0004318 A1 | 1/2015 | Alasaarela et al. |
| 2015/0014178 A1 | 1/2015 | Hiraoka et al. |
| 2015/0086729 A1 | 3/2015 | Gorzen et al. |
| 2015/0096495 A1 | 4/2015 | Jeong |
| 2015/0099365 A1 | 4/2015 | Chen et al. |
| 2015/0170947 A1 | 6/2015 | Bluck et al. |
| 2015/0214083 A1 | 7/2015 | Kawakami et al. |
| 2015/0225585 A1 | 8/2015 | De Rossi et al. |
| 2015/0255254 A1* | 9/2015 | Gebeshuber ............ C23C 16/50 427/8 |
| 2015/0279632 A1 | 10/2015 | Lin et al. |
| 2015/0329982 A1 | 11/2015 | Miura et al. |
| 2016/0010209 A1 | 1/2016 | Hattori et al. |
| 2016/0093901 A1 | 3/2016 | Yoshizumi et al. |
| 2016/0122874 A1 | 5/2016 | Vermeer et al. |
| 2016/0148801 A1 | 5/2016 | Yabe et al. |
| 2016/0319422 A1 | 11/2016 | Kurita et al. |
| 2016/0329223 A1 | 11/2016 | Hirose |
| 2016/0362788 A1 | 12/2016 | Kurita et al. |
| 2017/0002468 A1 | 1/2017 | Choi et al. |
| 2017/0018926 A1 | 1/2017 | Coumou et al. |
| 2017/0058402 A1 | 3/2017 | Wenxu et al. |
| 2017/0062258 A1 | 3/2017 | Bluck et al. |
| 2017/0125200 A1 | 5/2017 | Burkhart et al. |
| 2017/0209915 A1 | 7/2017 | Iguma et al. |
| 2017/0209916 A1 | 7/2017 | Iguma et al. |
| 2017/0229317 A1 | 8/2017 | Shen et al. |
| 2017/0271194 A1 | 9/2017 | Okita et al. |
| 2017/0278761 A1 | 9/2017 | deVilliers |
| 2017/0306483 A1 | 10/2017 | Iizuka |
| 2017/0306492 A1 | 10/2017 | Iizuka |
| 2017/0309455 A1 | 10/2017 | Yoshimura et al. |
| 2017/0335459 A1* | 11/2017 | Choi ................. H01L 21/68735 |
| 2018/0148842 A1 | 5/2018 | Matsumoto et al. |
| 2018/0174800 A1 | 6/2018 | Baba et al. |
| 2019/0096640 A1 | 3/2019 | Kato |
| 2019/0276937 A1 | 9/2019 | Olejnicek et al. |

FOREIGN PATENT DOCUMENTS

| | | |
|---|---|---|
| JP | H07-199450 A | 8/1995 |
| JP | 2009-062579 A | 3/2009 |
| JP | 2013-206652 A | 10/2013 |
| JP | 2017129086 A | 7/2017 |
| JP | 2017129088 A | 7/2017 |
| JP | 2017-197837 A | 11/2017 |
| JP | 2017197779 A | 11/2017 |
| JP | 2017197781 A | 11/2017 |
| KR | 20060117794 A | 11/2006 |
| KR | 20060128303 A | 12/2006 |
| KR | 1020170025417 A | 3/2017 |
| WO | 2014/132892 A1 | 9/2014 |
| WO | 2016/190007 A1 | 12/2016 |
| WO | 2018/059609 A1 | 4/2018 |

OTHER PUBLICATIONS

United States Patent and Trademark Office, Non-Final Office Action issued to U.S. Appl. No. 15/491,350 dated Oct. 22, 2019, 6 pages.
United States Patent and Trademark Office, Non-Final Office Action issued to U.S. Appl. No. 15/491,350 dated Mar. 20, 2020, 18 pages.
Non-Final Office Action, United States Patent and Trademark Office, issued to U.S. Appl. No. 15/834,812 dated Nov. 13, 2020, 46 pages.
Advisory Action, United States Patent and Trademark Office, issued to U.S. Appl. No. 15/491,350 dated Dec. 18, 2020, 5 pages.
U.S. Appl. No. 15/834,812, filed Dec. 7, 2017.
United States Patent and Trademark Office, Non-Final Office Action, issued to U.S. Appl. No. 15/834,812 dated Jan. 9, 2020.
United States Patent and Trademark Office, Final Office Action, issued to U.S. Appl. No. 15/834,812 dated Jul. 10, 2020.
United States Patent and Trademark Office, Final Office Action, issued to U.S. Appl. No. 15/491,350 dated Oct. 1, 2020.
Non-Final Office Action, United States Patent and Trademark Office, issued to U.S. Appl. No. 15/491,350 dated Feb. 4, 2021, 13 pages.
Final Office Action, United States Patent and Trademark Office, issued to U.S. Appl. No. 15/834,812 dated Apr. 28, 2021, 71 pages.
Advisory Action, United Staes Patent and Trademark Office, issued to U.S. Appl. No. 15/834,812 dated Jul. 16, 2021, 10 pages.
United States Patent and Trademark Office, Final Office Action, issued to U.S. Appl. No. 15/491,350 dated Aug. 25, 2021, 15 pages.
Notice of Allowance, United States Patent and Trademark Office, issued to U.S. Appl. No. 15/834,812 dated Dec. 2, 2021, 21 pages.
Non-Final Office Action, United States Patent and Trademark Office, issued to U.S. Appl. No. 15/491,350 dated Dec. 9, 2021, 19 pages.
Supplemental Notice of Allowance, United States Patent and Trademark Office, issued to U.S. Appl. No. 15/834,812 dated Dec. 14, 2021, 2 pages.
Supplemental Notice of Allowability, United States Patent and Trademark Office, issued to U.S. Appl. No. 15/834,812 dated Jan. 19, 2022, 6 pages.

* cited by examiner

PLASMA PROCESSING APPARATUS

INCORPORATION BY REFERENCE

The disclosure of Japanese Patent Application No. 2017-183356 filed on Sep. 25, 2017 including the specification, drawings and abstract is incorporated herein by reference in its entirety.

BACKGROUND

1. Technical Field

The disclosure relates to a plasma processing apparatus which performs plasma processing on a conductive workpiece.

2. Description of Related Art

As an apparatus which performs plasma processing on a workpiece, an apparatus in which a workpiece is sandwiched between two vertically divided film forming containers and a plasma is generated in the film forming containers to form a film is described in Japanese Unexamined Patent Application Publication No. 2009-62579 (JP 2009-62579 A).

SUMMARY

In a case where a plasma is generated in the film forming containers with the workpiece sandwiched between the film forming containers, there may be cases where abnormal discharge occurs in the film forming containers.

The disclosure can be realized as follows.

An aspect of the disclosure relates to a plasma processing apparatus configured to perform plasma processing on a conductive workpiece having a flat plate shape. The plasma processing apparatus includes: a conductive vacuum chamber having a recessed portion and a peripheral edge portion provided outside the recessed portion to be continuous with the recessed portion, the recessed portion being configured to cause a processing object portion of at least one side of the workpiece having a flat plate shape to be disposed in the recessed portion; a holding member configured to hold the workpiece to be separated and insulated from the peripheral edge portion; a voltage application unit configured to apply a voltage between the workpiece and the vacuum chamber; and an insulating layer configured to cover a portion of the peripheral edge portion facing the workpiece. With the plasma processing apparatus according to the aspect of the disclosure, since the portion of the peripheral edge portion facing the workpiece is covered with the insulating layer, the occurrence of abnormal discharge between the workpiece and the peripheral edge portion can be suppressed while the workpiece is subjected to plasma processing by applying a voltage between the workpiece and the vacuum chamber.

In the plasma processing apparatus according to the aspect, the recessed portion may include a bottom portion and a side portion which connects the bottom portion to the peripheral edge portion. The insulating layer may be configured to cover the side portion in addition to the portion of the peripheral edge portion facing the workpiece. According to the aspect of the disclosure, the occurrence of abnormal discharge between the side portion, which is connected to the peripheral edge portion and is an electrode portion close to the workpiece, and the workpiece can be suppressed.

In the plasma processing apparatus according to the aspect, the insulating layer may be configured to be detachable from the vacuum chamber. According to the aspect of the disclosure, even in a case where foreign matter or the like generated during the plasma processing adheres to the surface of the insulating layer, the insulating layer can be detached from the vacuum chambers to be replaced and cleaned. Therefore, the occurrence of abnormal discharge due to the deposition of foreign matter on the surface of the insulating layer can be suppressed.

In the plasma processing apparatus according to the aspect, the recessed portion may include a first recessed portion and a second recessed portion provided corresponding to a front side and a rear side of the workpiece. According to the aspect of the disclosure, while the front side and the rear side of the workpiece are subjected to plasma processing, the occurrence of abnormal discharge between the workpiece and the peripheral edge portion can be suppressed.

The disclosure can be embodied in various forms other than the plasma processing apparatus described above. For example, the disclosure can be embodied in the form of a method of performing plasma processing on a portion of a workpiece.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

First Embodiment

Figure 1:
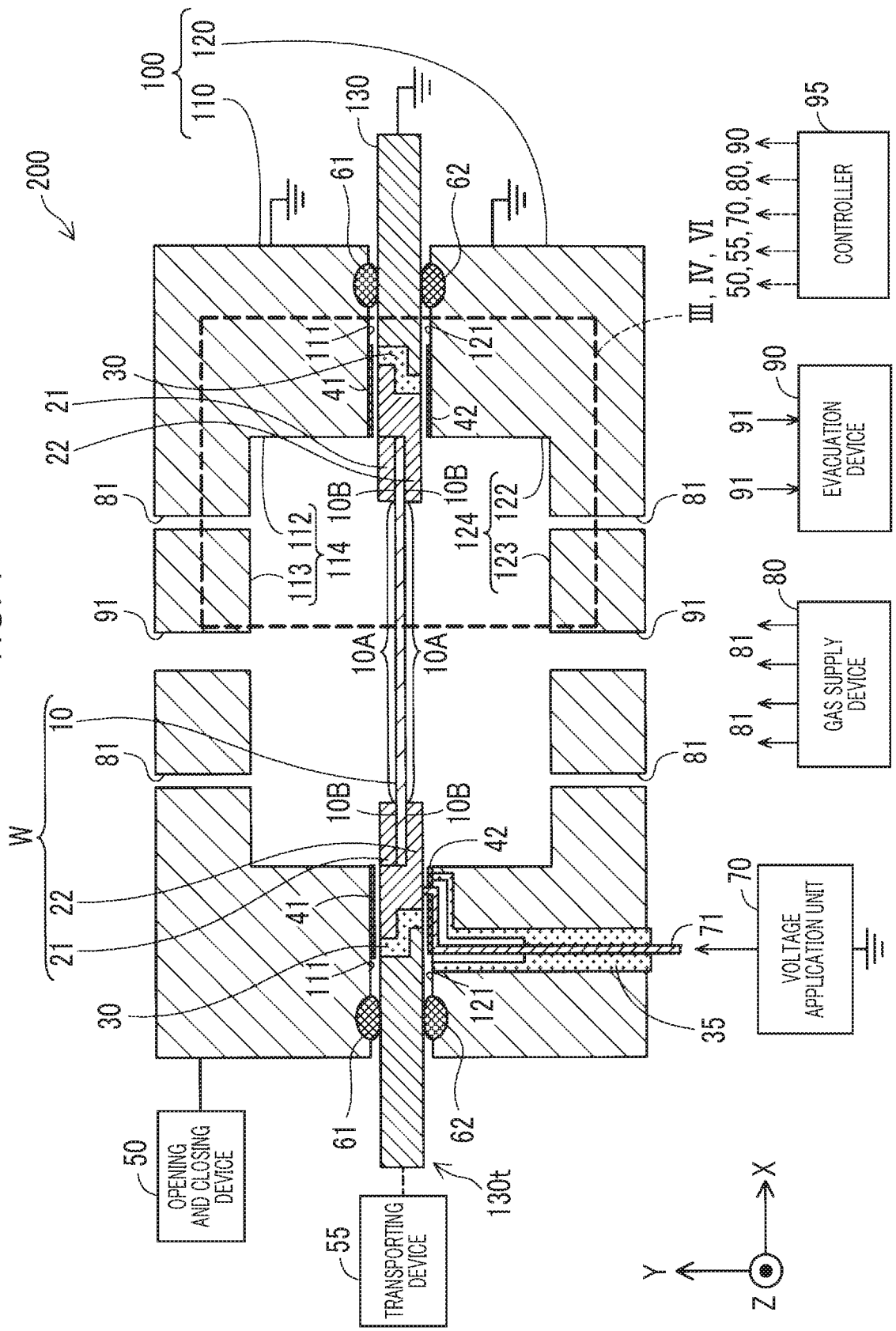
FIG. 1 is a schematic sectional view illustrating a configuration of a plasma processing apparatus according to a first embodiment.
Figure 2:
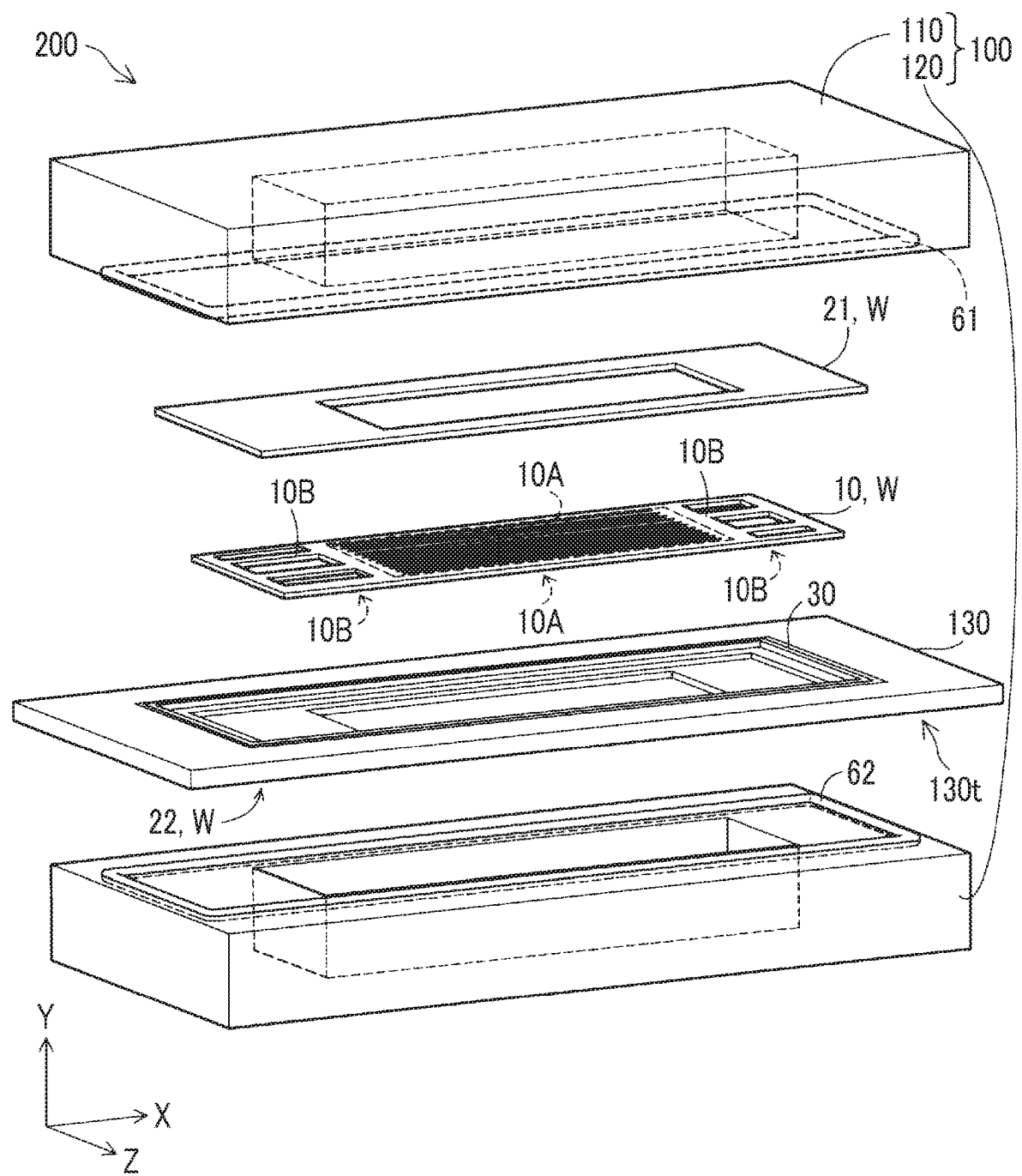
FIG. 2 is an exploded perspective view of the plasma processing apparatus.

FIG. 1 is a schematic sectional view illustrating a configuration of a plasma processing apparatus 200 according to a first embodiment. FIG. 2 is an exploded perspective view of the plasma processing apparatus 200. In FIGS. 1 and 2, X, Y, and Z axes substantially orthogonal to each other are shown. Being substantially orthogonal includes a range of 90°±20°. In the first embodiment, the Y direction is a substantially vertical direction, and the X direction is a substantially horizontal direction. The Z direction is a direction perpendicular to the substantially vertical direction and the substantially horizontal direction. This is also applied to the following figures.

The plasma processing apparatus 200 is an apparatus which performs plasma processing on a portion of a conductive workpiece W having a flat plate shape. The plasma processing is a process of performing film formation or etching on the workpiece W using a plasma. In the first embodiment, the workpiece W includes a processing object 10 and masking members 21, 22. In the first embodiment, the processing object 10 is a metal having a flat plate shape used as a base material of a separator of a fuel cell, and is formed of, for example, titanium or a titanium alloy. The plasma processing apparatus 200 forms a conductive carbon-based thin film on a processing object portion 10A of the processing object 10, for example, by a plasma chemical vapor deposition (CVD) method.

The plasma processing apparatus 200 includes a vacuum chamber 100, an insulating member 30, a pallet 130, sealing members 61, 62, insulating layers 41, 42, and a voltage application unit 70. The plasma processing apparatus 200 further includes an opening and closing device 50, a transporting device 55, a gas supply device 80, an evacuation device 90, and a controller 95. In FIG. 2, illustration of the insulating layers 41, 42, the opening and closing device 50, the transporting device 55, the voltage application unit 70 and an introducing portion 71, the gas supply device 80 and a supply port 81, the evacuation device 90 and an evacuation port 91, and the controller 95 is omitted.

In the first embodiment, the vacuum chamber 100 is a conductive container provided with a first mold 110 and a second mold 120 which are disposed to face each other. In the first embodiment, the vacuum chamber 100 is divided into a +Y direction and a −Y direction. For example, the vacuum chamber 100 is formed of a metal such as stainless steel, aluminum, or titanium.

The first mold 110 includes a first recessed portion 114 in which the processing object portion 10A of one side of the workpiece W is disposed, and a first peripheral edge portion 111 which is provided outside the first recessed portion 114 to be continuous with the first recessed portion 114. The first recessed portion 114 is provided corresponding to the front side of the workpiece W. In a state in which the workpiece W is disposed in the vacuum chamber 100, the first recessed portion 114 is recessed in a direction away from the workpiece W, and in the first embodiment, is recessed in an upward direction (+Y direction) when viewed from the processing object portion 10A of the upper surface side of the workpiece W. The first recessed portion 114 includes a bottom portion 113, and a side portion 112 which connects the bottom portion 113 and the first peripheral edge portion 111. The first peripheral edge portion 111 faces at least a portion of the workpiece W other than the processing object portion 10A in a state being separated therefrom. In the first embodiment, the first peripheral edge portion 111 faces a portion of the masking members 21, 22 in a state being separated therefrom. In the first embodiment, a connection portion between the side portion 112 and the first peripheral edge portion 111 is positioned on the same YZ plane as an end portion of the processing object 10.

The second mold 120 includes a second recessed portion 124, and a second peripheral edge portion 121 which is provided outside the second recessed portion 124 to be continuous with the second recessed portion 124. The second recessed portion 124 is provided corresponding to the rear side of the workpiece W. In the state in which the workpiece W is disposed in the vacuum chamber 100, the second recessed portion 124 is recessed in a downward direction (−Y direction) when viewed from the processing object portion 10A of the lower surface side of the workpiece W. The second recessed portion 124 includes a bottom portion 123, and a side portion 122 which connects the bottom portion 123 and the second peripheral edge portion 121. The second peripheral edge portion 121 faces at least a portion of the workpiece W other than the processing object portion 10A in a state being separated therefrom. In the first embodiment, the second peripheral edge portion 121 faces a portion of the lower masking member 22 in a state being separated therefrom. The second peripheral edge portion 121 is disposed in a portion corresponding to the first peripheral edge portion 111 of the first mold 110. In the first embodiment, a connection portion between the side portion 122 and the second peripheral edge portion 121 is positioned on the same YZ plane as the end portion of the processing object 10. In the first embodiment, the first peripheral edge portion 111 and the second peripheral edge portion 121 are parallel to an XZ plane.

The first mold 110 and the second mold 120 include a supply port 81 for supplying gas from the gas supply device 80 into the vacuum chamber 100, and an evacuation port 91 for evacuating the vacuum chamber 100 by the evacuation device 90. The supply port 81 and the evacuation port 91 are provided with valves that can be opened and closed. The second mold 120 includes the introducing portion 71 for applying a voltage between the workpiece W and the vacuum chamber 100. The second mold 120 and the introducing portion 71 are electrically insulated from each other by the insulating member 30. In the first embodiment, the vacuum chamber 100 has an earth potential.

Figure 3:
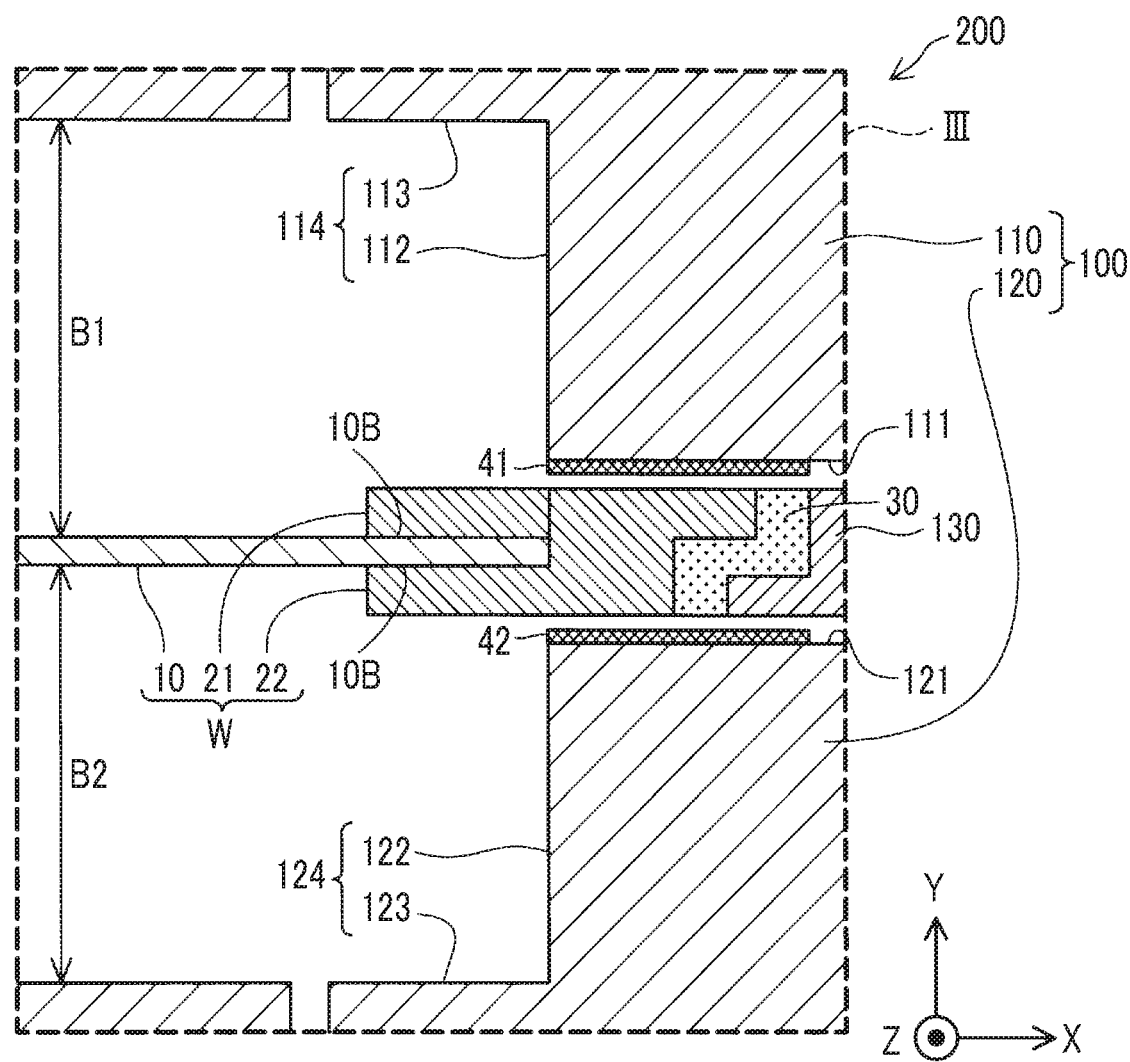
FIG. 3 is an enlarged partial sectional view of the plasma processing apparatus.

FIG. 3 is an enlarged partial sectional view of the plasma processing apparatus 200. FIG. 3 illustrates the part III in FIG. 1. As illustrated in FIG. 3, a portion of the first peripheral edge portion 111 facing the workpiece W is covered with the insulating layer 41. In the first embodiment, the insulating layer 41 continuously covers the portion facing the masking members 21, 22 and the portion of the first peripheral edge portion 111 facing the insulating member 30. In the first embodiment, a portion of the second peripheral edge portion 121 facing the workpiece W is covered with the insulating layer 42. In the first embodiment, the insulating layer 42 continuously covers the portion of the second peripheral edge portion 121 facing the masking members 21, 22 and the portion of the second peripheral edge portion 121 facing the insulating member 30, and a portion of the second peripheral edge portion 121 facing a portion of the pallet 130. The insulating layer 41 is formed by coating the surface of the first peripheral edge portion 111 with an insulating material, and the insulating layer 42 is formed by coating the surface of the second peripheral edge portion 121 with an insulating material. The coating can be performed by spray coating, painting, spraying, vapor deposition, or the like of the insulating material. In the first embodiment, the thickness of the insulating layers 41, 42 along the Y direction is about 400 μm. From the viewpoint of sufficiently maintaining insulating properties, it is preferable that the thickness of the insulating layers 41, 42 along the Y direction is, for example, 300 μm or more. From the viewpoint of suppressing peeling of the insulating layers 41, 42 formed by coating from the first peripheral edge portion 111 and the second peripheral edge portion 121, it is preferable that the thickness of the insulating layers 41, 42 along the Y direction is, for example, 500 μm or less. In the first embodiment, the insulating layers 41, 42 are formed of white alumina which is high purity aluminum oxide. As the insulating material used for the insulating layers 41, 42, for example, aluminum oxide, silicon oxide, zirconium oxide, magnesium oxide, titanium oxide, or a combination of two or more thereof may be used.

Returning to FIGS. 1 and 2, the masking members 21, 22 are members that cover a non-processing object portion 10B of the processing object 10. In other words, the masking members 21, 22 are members which are open to the processing object portion 10A of the processing object 10. In the first embodiment, the masking member 21 (upper masking member 21) is disposed on the first mold 110 side of the processing object 10. The masking member 22 (lower masking member 22) is disposed on the second mold 120 side of the processing object 10. In the first embodiment, the lower masking member 22 supports the processing object 10. In the first embodiment, a portion of the masking members 21, 22 is disposed in the first recessed portion 114 and the second recessed portion 124, and the other portion is disposed between the first peripheral edge portion 111 and the second peripheral edge portion 121. The masking members 21, 22 have conductivity. The masking members 21, 22 may be formed of the same material as the workpiece W. The processing object 10 and the masking members 21, 22 are in contact with each other and thus are electrically connected to each other. In the first embodiment, as illustrated in FIGS. 1 to 4, the non-processing object portion 10B is positioned in the outer periphery of the processing object 10, and the masking members 21, 22 cover the outer peripheral portion of the processing object 10. However, for example, in a case where the non-processing object portion 10B is present in a portion of the central portion of the processing object 10, the masking members, 21, 22 may have a shape that covers the portion of the central portion.

The insulating member 30 is disposed between the first peripheral edge portion 111 and the second peripheral edge portion 121, and is in contact with the lower masking member 22 of the workpiece W. The insulating member 30 is in contact with the lower masking member 22 and supports the lower masking member 22. For example, the insulating member 30 is formed of aluminum oxide, silicon oxide, zirconium oxide, magnesium oxide, titanium oxide, or a combination of two or more thereof.

The pallet 130 is a conductive plate-shaped member. The pallet 130 is also a member which transports the workpiece W into the vacuum chamber 100. The pallet 130 is disposed between the first peripheral edge portion 111 and the second peripheral edge portion 121. In the first embodiment, the insulating member 30, the lower masking member 22, the processing object 10, and the upper masking member 21 are stacked on the pallet 130 in this order in the +Y direction. The pallet 130 holds the workpiece W via the insulating member 30. In the first embodiment, the pallet 130 has an edge portion 130t which is exposed to the outside of the vacuum chamber 100 in a state in which the vacuum chamber 100 is closed. The edge portion 130t is a portion which comes in contact with the pallet 130 when the transporting device 55, which will be described later, transports the pallet 130. In the first embodiment, the pallet 130 has an earth potential. For example, the pallet 130 is formed of aluminum, stainless steel, or titanium.

The sealing members 61, 62 are disposed between the first peripheral edge portion 111 and the second peripheral edge portion 121 and are in contact with the pallet 130. The sealing members 61, 62 are members for maintaining airtightness in the vacuum chamber 100. The sealing members 61, 62 are insulating members and are annular members made of rubber in the first embodiment. In the first embodiment, O-rings are used as the sealing members 61, 62. In the first embodiment, the sealing member 61 is fitted into a groove portion provided in the first mold 110. The sealing member 62 is fitted into a groove portion provided in the second mold 120. In the first embodiment, the sealing members 61, 62 and the pallet 130 are also holding members which hold the workpiece W to be separated and insulated from the first peripheral edge portion 111 and the second peripheral edge portion 121.

The opening and closing device 50 is a device for opening and closing the vacuum chamber 100. In the first embodiment, the opening and closing device 50 opens the vacuum chamber 100 by moving the first mold 110 in the +Y direction and closes the vacuum chamber 100 by moving the first mold 110 in the −Y direction.

The transporting device 55 is a device for transporting the pallet 130 into the vacuum chamber 100 and transporting the pallet 130 to the outside of the vacuum chamber 100. In the first embodiment, the transporting device 55 comes in contact with the edge portion 130t of the pallet 130, and in a state in which the vacuum chamber 100 is open, transports the pallet 130, and the insulating member 30, the masking members 21, 22, and the processing object 10 stacked on the pallet 130 into the vacuum chamber 100. The transporting device 55 moves the transported pallet 130 downward so as to cause the pallet 130 to be provided on the second mold 120 via the sealing member 62. The transporting device 55 can also move the pallet 130 moved upward along the XZ plane to be transported to the outside of the vacuum chamber 100.

The voltage application unit 70 is a device for applying a voltage between the workpiece W and the vacuum chamber 100. The voltage application unit 70 generates an electric field for generating a plasma from a source gas supplied into the vacuum chamber 100. In the first embodiment, the introducing portion 71 and the workpiece W (the processing object 10 and the masking members 21, 22) are cathodes, and the first mold 110, the second mold 120, and the pallet 130 are anodes. In the first embodiment, the voltage application unit 70 applies a bias voltage between the workpiece W and the vacuum chamber. The voltage application unit 70 can apply a voltage of −3000 V between the workpiece W and the vacuum chamber 100 via the introducing portion 71. In the first embodiment, the vacuum chamber 100 and the pallet 130 are connected to the earth (0 V).

The gas supply device 80 supplies a carrier gas and the source gas into the vacuum chamber 100 via the supply port 81. In the first embodiment, the gas supply device 80 supplies, for example, nitrogen ($N_2$) gas or argon (Ar) gas as the carrier gas and supplies, for example, pyridine ($C_5H_5N$) gas as the source gas. The gas supply device 80 is connected to tanks which store different types of gas. The gas supply device 80 can change the type of the gas supplied to the supply port 81 by operating a switching valve provided between each of the tanks and the supply port 81. In order to return the pressure in the vacuum chamber 100 to a pressure at which the opening and closing device 50 can open the vacuum chamber 100, the gas supply device 80 supplies, for example, nitrogen gas into the vacuum chamber 100 after film formation or etching by the plasma processing apparatus 200 to return the pressure of the vacuum chamber 100.

The evacuation device 90 evacuates the vacuum chamber 100 via the evacuation port 91. The evacuation device 90 is formed by, for example, a rotary pump, a diffusion pump, or a turbomolecular pump.

The controller 95 controls the overlap operations of the plasma processing apparatus 200. The controller 95 includes a central processing unit (CPU) and a memory. The CPU controls the plasma processing apparatus 200 by executing a program stored in the memory. The program may be recorded on various recording media. For example, the controller 95 controls the opening and closing device 50 to open the vacuum chamber 100, and controls the transporting device 55 to transport the pallet 130. When the controller 95 closes the vacuum chamber 100 after the pallet 130 is transported into the vacuum chamber 100, the sealing members 61, 62 come in contact with the pallet 130 such that the workpiece W is separated from the first peripheral edge portion 111 and the second peripheral edge portion 121. The controller 95 controls the evacuation device 90 to evacuate the vacuum chamber 100, controls the gas supply device 80 to supply gas into the vacuum chamber 100, and controls the voltage application unit 70 to apply a voltage between the workpiece W and the vacuum chamber 100.

Figure 4:
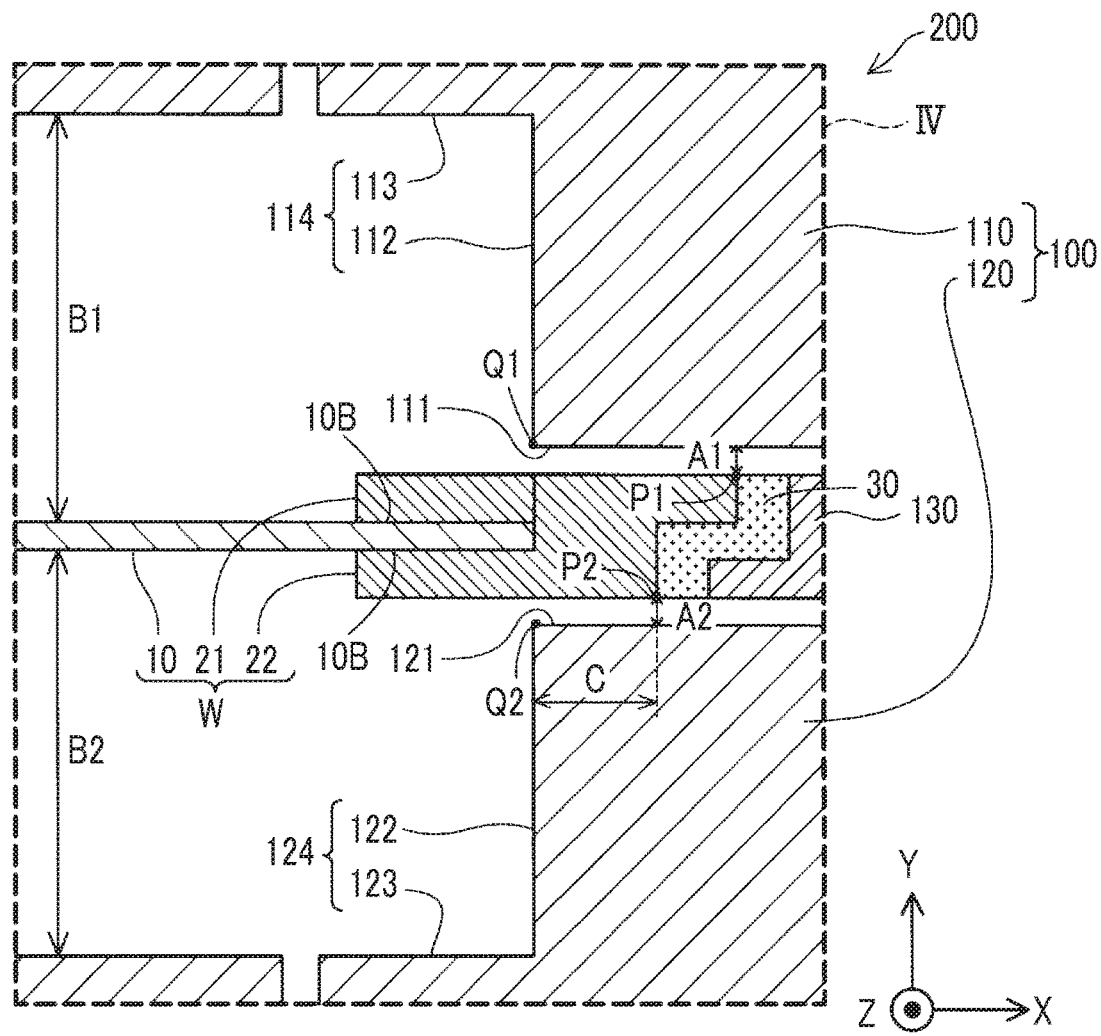
FIG. 4 is an enlarged partial sectional view of the plasma processing apparatus.

FIG. 4 is an enlarged partial sectional view of the plasma processing apparatus 200. In FIG. 4, the portion IV indicated by the broken line in FIG. 1 is illustrated. For convenience of description, in FIG. 4, illustration of the insulating layers 41, 42 illustrated in FIG. 3 is omitted. FIG. 4 illustrates a portion (contact point P1) where the workpiece W and the insulating member 30 are in contact with each other, and a portion (contact point P2) where the workpiece W and the insulating member 30 are in contact with each other. The contact point P1 is a portion facing the first peripheral edge portion 111 among the portions where the workpiece W and the insulating member 30 are in contact with each other. The contact point P1 is a contact portion closest to the first peripheral edge portion 111 among the portions where the workpiece W and the insulating member 30 are in contact with each other in the section (FIG. 4) of the plasma processing apparatus 200. The contact point P2 is a portion facing the second peripheral edge portion 121 among the portions where the workpiece W and the insulating member 30 are in contact with each other. The contact point P2 is a contact portion closest to the second peripheral edge portion 121 among the portions where the workpiece W and the insulating member 30 are in contact with each other in the section (FIG. 4) of the plasma processing apparatus 200. FIG. 4 further illustrates a distance A1 between the contact point P1 and the first peripheral edge portion 111 and a distance B1 between the workpiece W and the bottom portion 113 of the first recessed portion 114. The distance A1 is the shortest distance between the contact portion between the workpiece W and the insulating member 30 and the first peripheral edge portion 111. The distance B1 is a distance between the workpiece W facing the first recessed portion 114 and the bottom portion 113 of the first recessed portion 114, and is the shortest distance between the bottom portion 113 of the first recessed portion 114 and the workpiece W. FIG. 4 illustrates a distance A2 between the contact point P2 and the second peripheral edge portion 121 and a distance B2 between the workpiece W and the bottom portion 123 of the second recessed portion 124. The distance A2 is the shortest distance between the contact portion between the workpiece W and the insulating member 30 and the second peripheral edge portion 121. The distance B2 is a distance between the workpiece W facing the second recessed portion 124 and the bottom portion 123 of the second recessed portion 124, and is the shortest distance between the bottom portion 123 of the second recessed portion 124 and the workpiece W. In the plasma processing apparatus 200, the distance A1 is smaller than the distance B1. In other words, the space formed by the workpiece W and the first peripheral edge portion 111 is smaller than the space formed by the workpiece W and the first recessed portion 114. In the first embodiment, the distance A2 is smaller than the distance B2. In other words, the space formed by the workpiece W and the second peripheral edge portion 121 is smaller than the space formed by the workpiece W and the second recessed portion 124.

The distance A1 and the distance A2 are shorter than the distance of a sheath formed between the workpiece W and the vacuum chamber 100 (the first peripheral edge portion 111 and the second peripheral edge portion 121) in a case where a voltage is applied between the workpiece W and the vacuum chamber 100. In the first embodiment, the distance A1 and the distance A2 are 2.0 mm or less. From the viewpoint of sufficiently maintaining the insulating properties between the vacuum chamber 100 and the workpiece W, it is preferable that the distance A1 and the distance A2 are, for example, larger than 0.5 mm.

FIG. 4 further illustrates the shortest distance C from a connection portion Q1 between the first recessed portion 114 and the first peripheral edge portion 111 and a connection portion Q2 between the second recessed portion 124 and the second peripheral edge portion 121 to the contact points P1, P2 along the X axis. The distance C is also the shortest distance from the side portion 112 of the first recessed portion 114 and the side portion 122 of the second recessed portion 124 to the contact points P1, P2 along the X axis. In the first embodiment, the distance C is larger than zero. In the first embodiment, the distance C is, for example, 10 mm or more.

Figure 5:
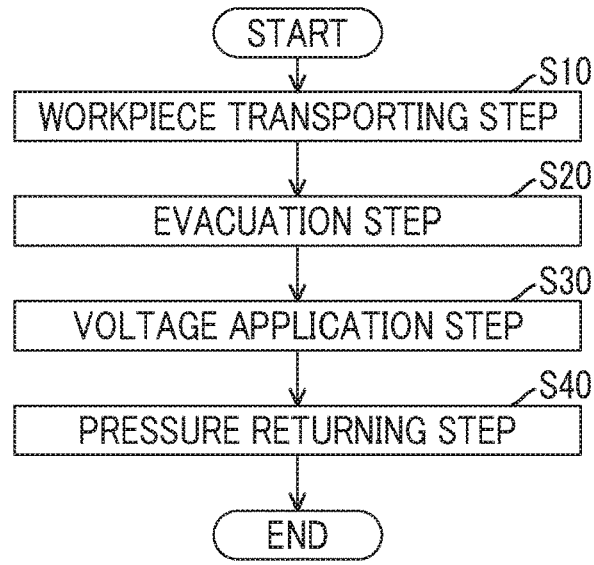
FIG. 5 is a process flowchart showing a plasma processing method of a workpiece by the plasma processing apparatus.

FIG. 5 is a process flowchart showing a plasma processing method of the workpiece W by the plasma processing apparatus 200. Hereinafter, a method of performing film formation on the processing object portion 10A of the processing object 10 by the plasma processing apparatus 200 will be described. In the film formation by the plasma processing apparatus 200, first, a transporting step of transporting the workpiece W into the vacuum chamber 100 is performed (step S10). In the first embodiment, the insulating member 30, the lower masking member 22, and the processing object 10 are stacked on the pallet 130, and the upper masking member 21 is stacked on the processing object 10. Accordingly, the non-processing object portion 10B of the processing object 10 is covered with the masking members 21, 22. Thereafter, the first mold 110 of the vacuum chamber 100 is moved in the +Y direction by the opening and closing device 50, and the pallet 130 on which the insulating member 30, the masking members 21, 22, and the processing object 10 are stacked is transported into the vacuum chamber 100 by the transporting device 55. The transported pallet 130 is placed on the second mold 120 via the sealing member 62. In the transporting step, when the pallet 130 is disposed on the second mold 120, the vacuum chamber 100 is closed. In the first embodiment, the first mold 110 is moved in the −Y direction by the opening and closing device 50. When the vacuum chamber 100 is closed, the sealing members 61, 62 come into contact with the pallet 130 such that the workpiece W and the first and second peripheral edge portions 111, 121 are separated from each other. Accordingly, a gap is formed between the workpiece W and the first peripheral edge portion 111, and a gap is formed between the workpiece W and the second peripheral edge portion 121. The distance A1 between the contact point P1 and the first peripheral edge portion 111 is shorter than the distance B1 between the workpiece W and the first recessed portion 114. The distance A2 between the contact point P2 and the second peripheral edge portion 121 is shorter than the distance B2 between the workpiece W and the second recessed portion 124.

An evacuation step of evacuating the gas in the vacuum chamber 100 is performed (step S20). In the first embodiment, the plasma processing apparatus 200 is installed, for example, in a nitrogen gas atmosphere. In the evacuation step, nitrogen gas in the vacuum chamber 100 is evacuated by the evacuation device 90 via the evacuation port 91 such that the vacuum chamber 100 is evacuated.

A voltage application step is performed (step S30). In the voltage application step, the gas is supplied into the vacuum chamber 100 via the supply port 81 by the gas supply device 80, and a voltage is applied between the workpiece W and the vacuum chamber 100 by the voltage application unit 70 such that a plasma is generated in the first recessed portion 114 and the second recessed portion 124. In the voltage application step, the inside of the vacuum chamber 100 increases in temperature.

In the first embodiment, the voltage application step includes a temperature increasing and etching step, a first layer forming step, and a deposition step. The temperature increasing and etching step is a step of increasing the temperature of the workpiece W and removing moisture and the like adhered to the workpiece W. The first layer forming step is a step of forming a dense layer on the workpiece W by controlling the voltage application unit 70 and the gas supply device 80 so as to cause a film forming rate to be relatively slow after the temperature increasing and etching step. The deposition step is a step of depositing a film on the first layer at a film forming rate higher than that for the formation of the first layer. For example, argon gas is supplied in the temperature increasing and etching step. In the first layer forming step and the deposition step, for example, hydrogen gas and argon gas are supplied as carrier gas, nitrogen gas and pyridine gas are supplied as source gases, and a thin film is formed on the processing object portion 10A of the processing object 10. When the voltage application step is ended, the supply of the gases and the application of the voltage are stopped.

A pressure returning step of adjusting the pressure in the vacuum chamber 100 is performed (step S40). In the first embodiment, the nitrogen gas is supplied into the vacuum chamber 100 by the gas supply device 80 so as to cause the pressure in the vacuum chamber 100 to be returned to a pressure at which the vacuum chamber 100 can be opened by the opening and closing device 50. When the pressure in the vacuum chamber 100 is adjusted, the first mold 110 is moved in the +Y direction by the opening and closing device 50, and the pallet 130 on which the insulating member 30, the masking members 21, 22, and the processing object 10 are stacked is taken out from the vacuum chamber 100 by the transporting device 55. As described above, a series of plasma processing operations by the plasma processing apparatus 200 is completed.

In the plasma processing apparatus 200, a voltage is applied between the vacuum chamber 100 and the workpiece W using the vacuum chamber 100 and the workpiece W as electrodes. Therefore, film formation or etching can be performed on the processing object portion 10A of the workpiece W in the first recessed portion 114 and the second recessed portion 124 without disposing additional electrodes in the vacuum chamber 100. It is preferable that the distance between the first peripheral edge portion 111 and the workpiece W which are the electrodes is adjusted to, for example, a distance at which the occurrence of abnormal discharge such as spark discharge or glow discharge between the first peripheral edge portion 111 and the workpiece W can be suppressed. This is because when abnormal discharge occurs between the first peripheral edge portion 111 and the workpiece W, film formation or etching is not normally performed on the workpiece W. However, the distance at which the occurrence of abnormal discharge can be suppressed varies depending on the pressure and voltage during plasma processing. There may be cases where strain occurs in the vacuum chamber 100 or the workpiece W due to the increase in the temperature of the vacuum chamber 100 during the plasma processing. Therefore, there may be cases where it is difficult to design the vacuum chamber 100 to suppress the occurrence of abnormal discharge. Similar problems may also occur between the second peripheral edge portion 121 and the workpiece W.

In the plasma processing apparatus 200 of the first embodiment, the portion of the first peripheral edge portion 111 facing the workpiece W is covered with the insulating layer 41. Therefore, while the workpiece W is subjected to plasma processing by applying a voltage between the workpiece W and the vacuum chamber 100, the occurrence of abnormal discharge between the first peripheral edge portion 111 and the workpiece W can be suppressed. Similarly, the portion of the second peripheral edge portion 121 facing the workpiece W is covered with the insulating layer 42. Therefore, while the workpiece W is subjected to plasma processing by applying a voltage between the workpiece W and the vacuum chamber 100, the occurrence of abnormal discharge between the second peripheral edge portion 121 and the workpiece W can be suppressed.

In the plasma processing apparatus 200 of the first embodiment, the first recessed portion 114 and the second recessed portion 124 are provided. Therefore, while the front side and the rear side of the workpiece W are subjected to plasma processing, the occurrence of abnormal discharge between the workpiece W and the first peripheral edge portion 111 and between the workpiece W and the second peripheral edge portion 121 can be suppressed.

In the plasma processing apparatus 200 of the first embodiment, in a state in which the vacuum chamber 100 is closed, the insulating member 30 which is in contact with the workpiece W is disposed between the first peripheral edge portion 111 of the first mold 110 and the second peripheral edge portion 121 of the second mold 120. The distance A1 between the contact point (contact portion) P1 between the workpiece W and the insulating member 30 and the first peripheral edge portion 111 is smaller than the distance B1 between the workpiece W and the bottom portion 113 of the first recessed portion 114. Therefore, the infiltration of the plasma from the first recessed portion 114 or the second recessed portion 124 into the space formed by the workpiece W and the first peripheral edge portion 111 is suppressed. Therefore, the amount of the plasma at the contact point P1 is reduced, so that the occurrence of abnormal discharge at the contact portion between the workpiece W and the insulating member 30 can be suppressed.

Similarly, the distance A2 between the contact point (contact portion) P2 between the workpiece W and the insulating member 30 and the second peripheral edge portion 121 is smaller than the distance B2 between the workpiece W and the bottom portion 123 of the second recessed portion 124. Therefore, the infiltration of the plasma from the second recessed portion 124 or the first recessed portion 114 into the space formed by the workpiece W and the second peripheral edge portion 121 is suppressed. Therefore, the amount of the plasma at the contact point P2 is reduced, so that the occurrence of abnormal discharge at the contact portion between the workpiece W and the insulating member 30 can be suppressed.

The distance C from the connection portion Q1 between the first recessed portion 114 and the first peripheral edge portion 111 and the connection portion Q2 between the second recessed portion 124 and the second peripheral edge portion 121 to the insulating member 30 along the X axis is larger than zero. Therefore, the space formed by the first recessed portion 114 and the second recessed portion 124 to generate a plasma and the contact points P1, P2 between the workpiece W and the insulating member 30 are separated from each other. Therefore, the amount of the plasma at the contact points P1, P2 is further reduced, so that the occurrence of abnormal discharge at the contact portion between the workpiece W and the insulating member 30 can be further suppressed.

In the plasma processing apparatus 200, the processing object portion 10A of the workpiece W is directed to the space in the first recessed portion 114 and the space in the second recessed portion 124, and the end portion of the workpiece W (the end portion of the lower masking member 22) is positioned between the first peripheral edge portion 111 and the second peripheral edge portion 121. Therefore, compared to a case where the entire workpiece W is accommodated in a space where a plasma is generated, the plasma processing apparatus 200 can be reduced in size. In the plasma processing apparatus 200, since the space to be evacuated for the plasma processing is smaller than the space in the related art, so that the time for the evacuation can be shortened. Therefore, the time needed for performing plasma processing on the workpiece W can be shortened.

Second Embodiment

Figure 6:
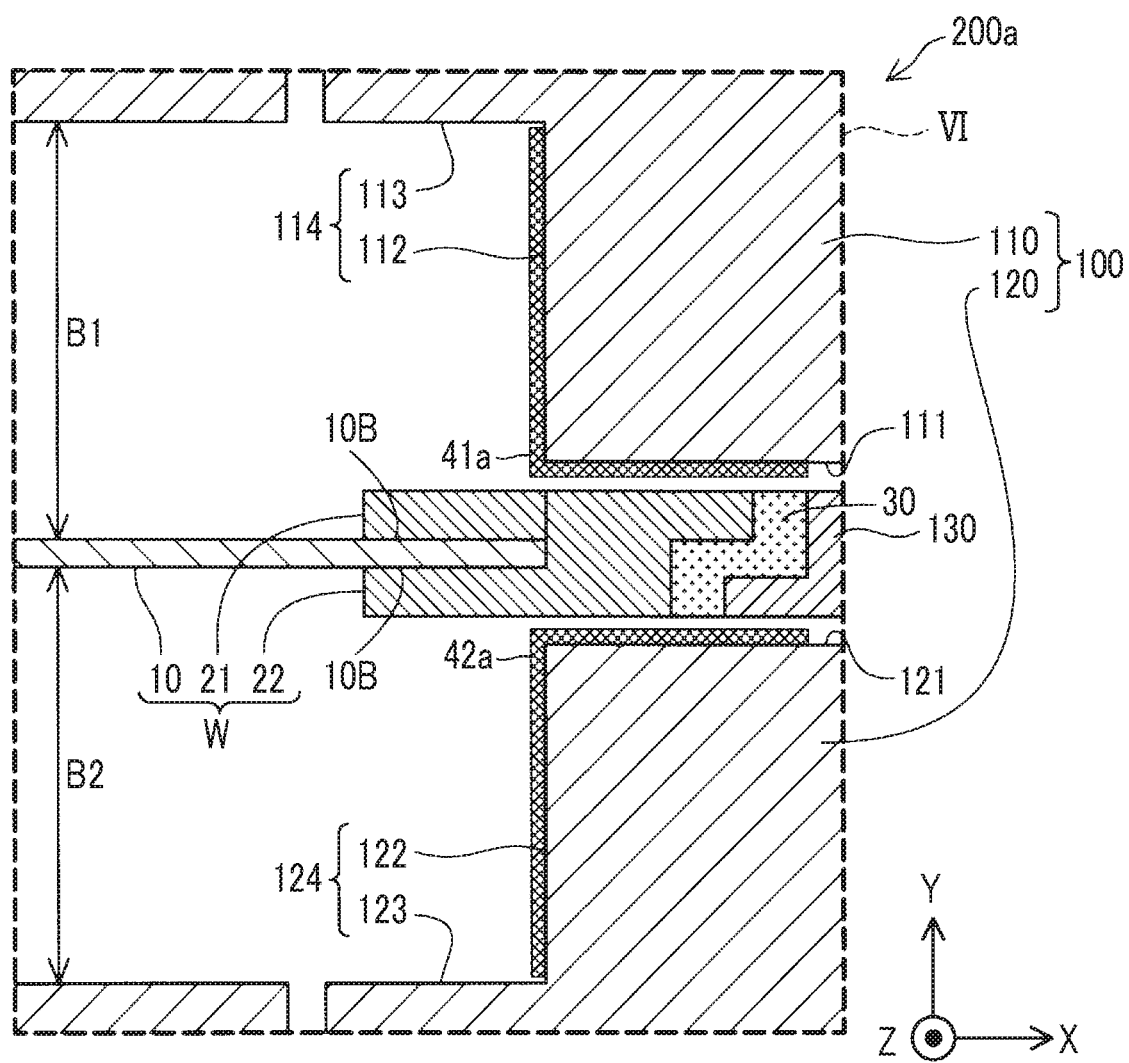
FIG. 6 is a view of a plasma processing apparatus according to a second embodiment.

FIG. 6 is an enlarged partial sectional view of a plasma processing apparatus 200a in a second embodiment. FIG. 6 illustrates a portion of the plasma processing apparatus 200a corresponding to VI illustrated in FIG. 1. The plasma processing apparatus 200a of the second embodiment is different from the plasma processing apparatus 200 of the first embodiment in that an insulating layer 41a covers the surface of the side portion 112 in addition to the portion of the first peripheral edge portion 111 facing the workpiece W. An insulating layer 42a covers the surface of the side portion 122 in addition to the portion of the second peripheral edge portion 121 facing the workpiece W. The insulating layer 41a is formed by coating the first peripheral edge portion 111 and the side portion 112 with an insulating material, and the insulating layer 42a is formed by coating the second peripheral edge portion 121 and the side portion 122 with an insulating material. The other configurations of the plasma processing apparatus 200a are the same as those of the plasma processing apparatus 200 of the first embodiment, so that the description thereof will be omitted.

With the plasma processing apparatus 200a of the second embodiment, the effect of the first embodiment is obtained, and moreover, the occurrence of abnormal discharge between the side portion 112, which is connected to the first peripheral edge portion 111 and is an electrode portion close to the workpiece W, and the workpiece W can be suppressed. Similarly, the occurrence of abnormal discharge between the side portion 122, which is connected to the second peripheral edge portion 121 and is an electrode portion close to the workpiece W, and the workpiece W can be suppressed.

As illustrated in FIG. 6, in the second embodiment, the insulating layer 41a covers the entire surface of the side portion 112, but the insulating layer 41a may cover a portion of the surface of the side portion 112. In the case described above, it is preferable that the insulating layer 41a covers, for example, at least the connection portion of the first peripheral edge portion 111, that is, a corner portion. The insulating layer 41a may not cover the side close to the bottom portion 113 (+Y direction side). Similarly, the insulating layer 42a may cover a portion of the surface of the side portion 122, and in the case described above, it is preferable that the insulating layer 42a covers, for example, at least the connection portion of the second peripheral edge portion 121, that is, a corner portion. According to the above description, abnormal discharge that occurs at the corner portion can be suppressed. The insulating layer 42a may not be disposed on the side close to the bottom portion 123 (−Y direction side). According to the above description, while suppressing the occurrence of abnormal discharge between the side portions 112, 122 and the workpiece W, an electrode area can be maintained. The portions of the side portions 112, 122 covered with the insulating layer 41a, 42a may be determined by obtaining the relationship between the presence or absence of the occurrence of abnormal discharge marks of the workpiece W due to the plasma processing and the portions where the insulating layers 41a, 42a are disposed through experiments or simulations.

The insulating layer covering the first peripheral edge portion 111 and the insulating layer covering the side portion 112 may be made of different insulating materials. Similarly, the insulating layer covering the second peripheral edge portion 121 and the insulating layer covering the side portion 122 may be made of different insulating materials.

Third Embodiment

Figure 7:
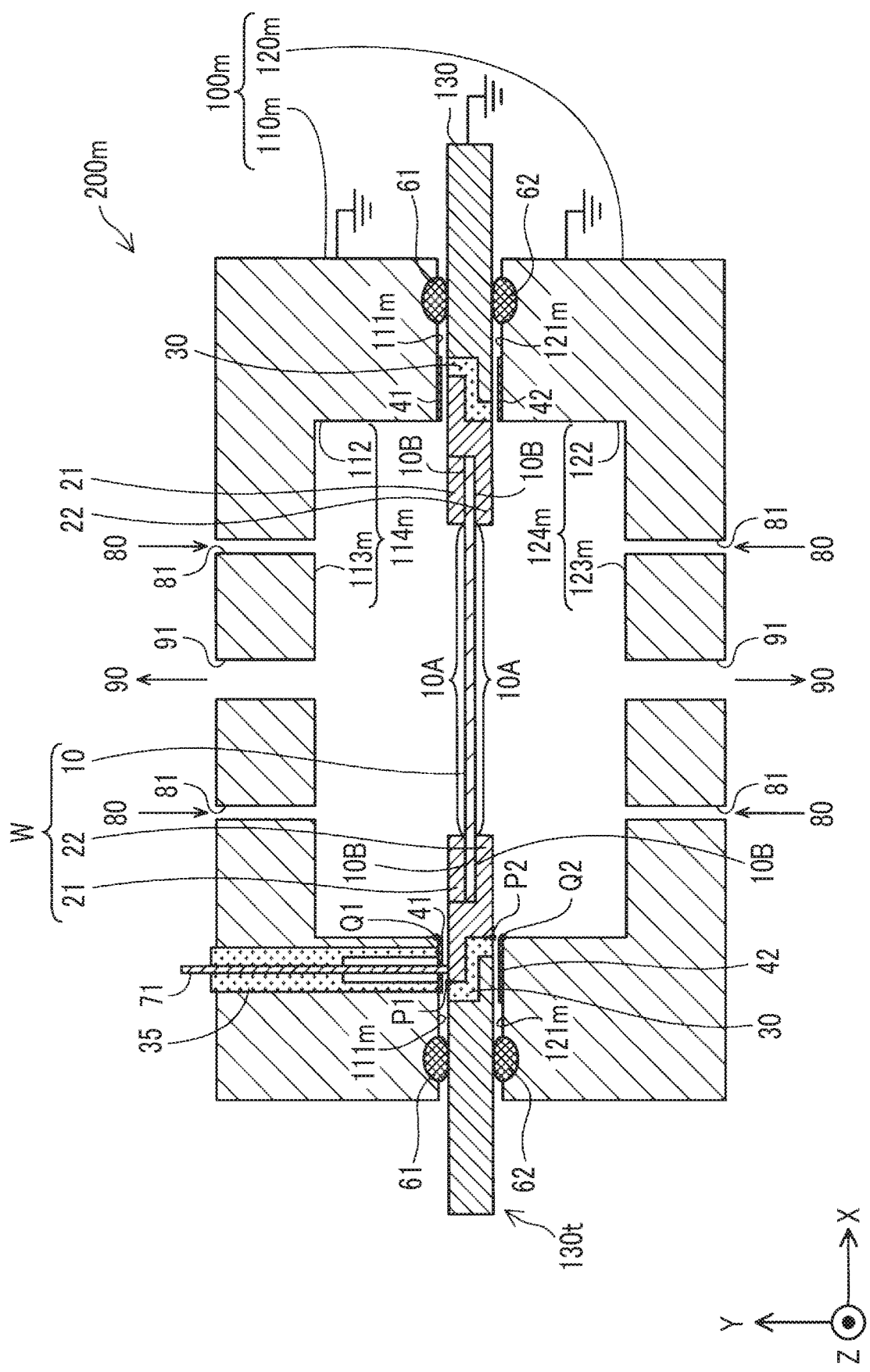
FIG. 7 is a view illustrating a plasma processing apparatus according to a third embodiment.

Hereinafter, in third to fifth embodiments, other configurations of the plasma processing apparatus will be described. FIG. 7 is a view illustrating a plasma processing apparatus 200m in the third embodiment. Also in the third embodiment, as in the first embodiment, portions of a first peripheral edge portion 111m and a second peripheral edge portion 121m facing the workpiece W are covered with the insulating layers 41, 42. The plasma processing apparatus 200m of the third embodiment is different from the plasma processing apparatus 200 of the first embodiment in that the shortest distance from the connection portion Q1 between a first recessed portion 114m of a first mold 110m and the first peripheral edge portion 111m and the connection portion Q2 between a second recessed portion 124m of a second mold 120m and the second peripheral edge portion 121m to the contact points P1, P2 between the workpiece W and the insulating member 30 along the first peripheral edge portion 111m is zero. In the third embodiment, the connection portion Q2 and the contact point P2 in the vacuum chamber 100m are positioned on the same YZ plane. As in the first embodiment described above, the distance between the contact point P1 and the first peripheral edge portion 111m is smaller than the distance between the workpiece W and the bottom portion 113m of the first recessed portion 114m. The distance between the contact point P2 and the second peripheral edge portion 121m is shorter than the distance between the workpiece W and the bottom portion 123m of the second recessed portion 124m. With the plasma processing apparatus 200m of the third embodiment, as in the first embodiment described above, the occurrence of abnormal discharge at the contact portion between the workpiece W and the insulating member can be suppressed.

Fourth Embodiment

Figure 8:
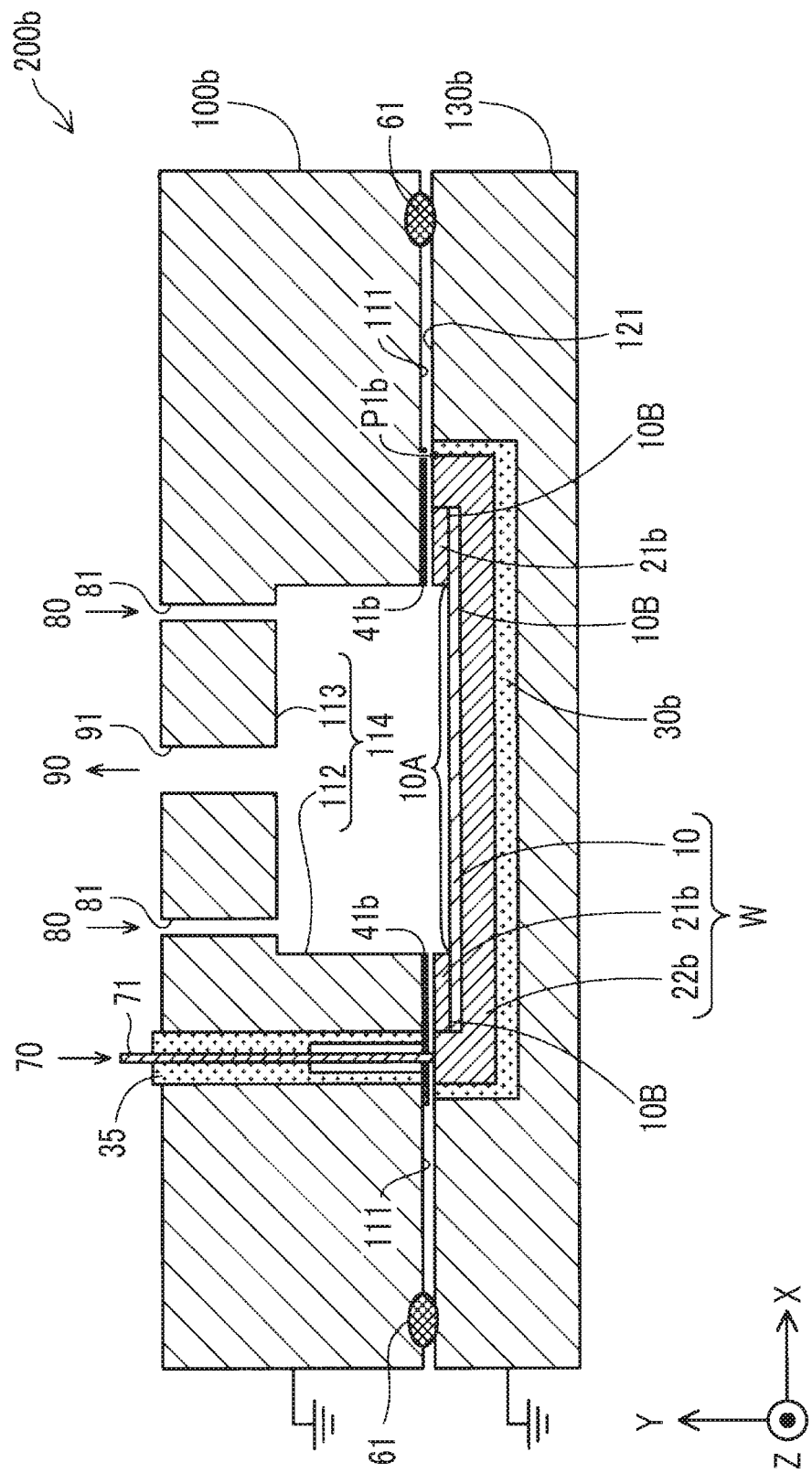
FIG. 8 is a view illustrating a plasma processing apparatus according to a fourth embodiment.

FIG. 8 is a view illustrating a plasma processing apparatus 200b in the fourth embodiment. Unlike the plasma processing apparatus 200 of the first embodiment, the plasma processing apparatus 200b of the fourth embodiment performs plasma processing on solely one side of the workpiece W. A vacuum chamber 100b does not include the second mold 120. An insulating member 30b is in contact with a pallet 130b, a lower masking member 22b is in contact with the insulating member 30b, the entire surface of the rear side of the processing object 10 is in contact with the lower masking member 22b, and an upper masking member 21b is in contact with the non-processing object portion 10B of the front side of the processing object 10. In the plasma processing apparatus 200b, the sealing member 61 having insulating properties is an example of the holding member. Also in the fourth embodiment, as in the first embodiment, the portion of the first peripheral edge portion 111 facing the workpiece W is covered with an insulating layer 41b. Also in the fourth embodiment, the distance between a contact portion P1b between the workpiece W and the insulating member 30b and the first peripheral edge portion 111 is smaller than the distance between the workpiece W and the bottom portion 113 of the first recessed portion 114. The other configurations of the plasma processing apparatus 200b in the fourth embodiment are the same as those of the first embodiment. Even with the plasma processing apparatus 200b of the fourth embodiment, as in the first embodiment described above, the occurrence of abnormal discharge at the contact portion between the workpiece W and the insulating member can be suppressed.

Fifth Embodiment

Figure 9:
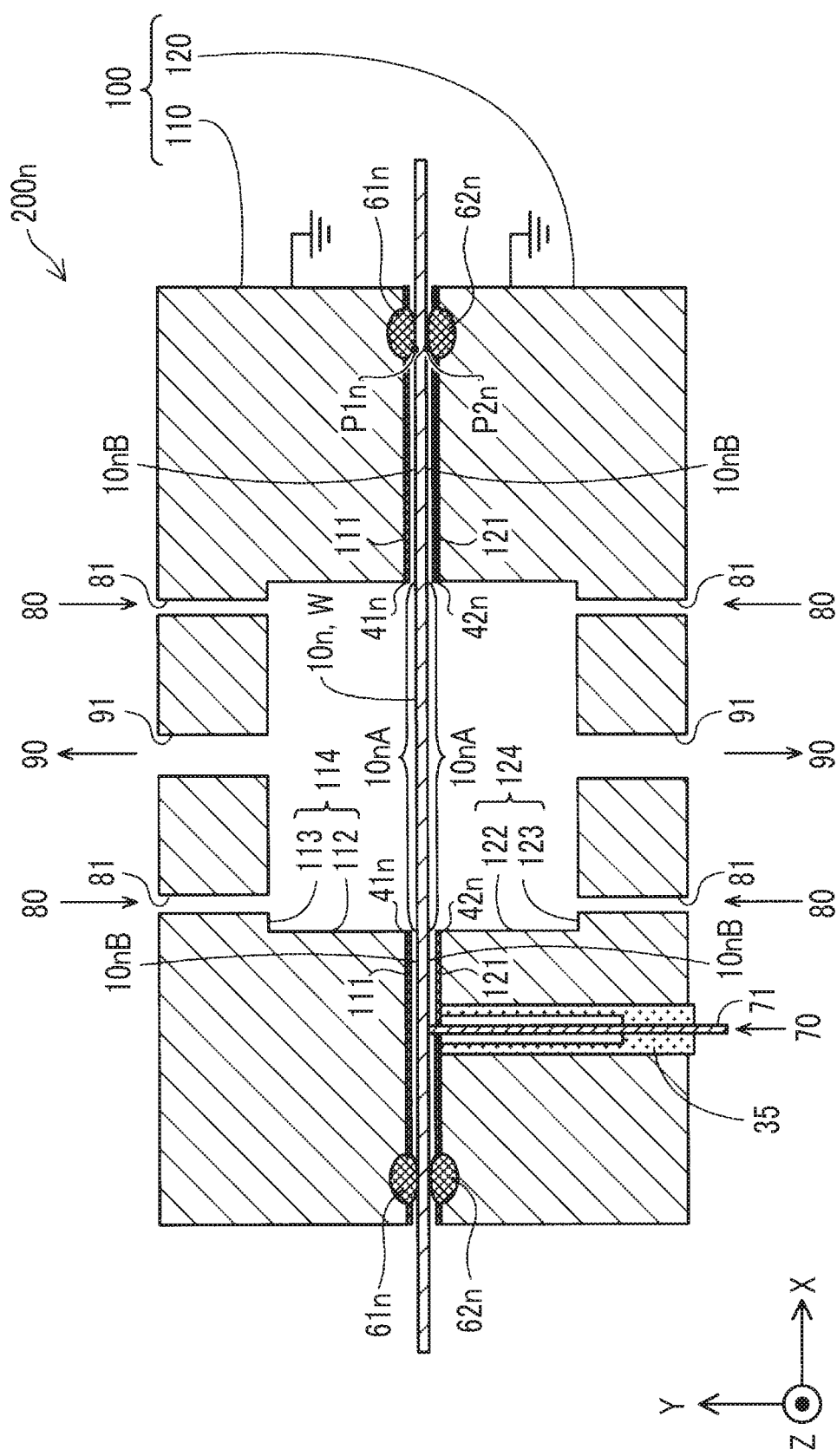
FIG. 9 is a view illustrating a plasma processing apparatus according to a fifth embodiment.

FIG. 9 is a view illustrating a plasma processing apparatus 200n in the fifth embodiment. The plasma processing apparatus 200n does not include the pallet 130 and the insulating member 30, and the workpiece W is transported into the vacuum chamber 100 by the transporting device 55. In the fifth embodiment, the workpiece W is a processing object 10n and does not include the masking members 21, 22 unlike the embodiments described above. A processing object portion 10nA is disposed in the first recessed portion 114 and the second recessed portion 124, and a non-processing object portion 10nB is disposed between the first peripheral edge portion 111 and the second peripheral edge portion 121. In the plasma processing apparatus 200n, sealing members 61n, 62n having insulating properties are in contact with the workpiece W between the first peripheral edge portion 111 and the second peripheral edge portion 121 to hold the workpiece W to be separated and insulated from the first peripheral edge portion 111 and the second peripheral edge portion 121. In the plasma processing apparatus 200n, the sealing members 61n, 62n are examples of the holding member. The sealing member 61n is in contact with the first peripheral edge portion 111 of the first mold 110 and the non-processing object portion 10nB of the processing object 10n. The sealing member 62n is in contact with the second peripheral edge portion 121 of the second mold 120 and the non-processing object portion 10nB. Also in the fifth embodiment, as in the first embodiment, the portion of the first peripheral edge portion 111 facing the workpiece W is covered with an insulating layer 41n, and the portion of the second peripheral edge portion 121 facing the workpiece W is covered with an insulating layer 42n. FIG. 9 illustrates a contact point P1n between the workpiece W and the sealing member 61n, and a contact point P2n between the workpiece W and the sealing member 62n. Also in the fifth embodiment, as in the first embodiment, the distance between the contact point P1n and the first peripheral edge portion 111 is smaller than the distance between the workpiece W and the bottom portion 113 of the first recessed portion 114. The distance between the contact point P2n and the second peripheral edge portion 121 is smaller than the distance between the workpiece W and the bottom portion 123 of the second recessed portion 124. Even with the plasma processing apparatus 200n of the fifth embodiment, as in the first embodiment described above, the occurrence of abnormal discharge at the contact portion between the workpiece W and the insulating member can be suppressed.

Sixth Embodiment

In the various embodiments described above, the insulating layers 41, 42, 41a, 42a, 41n, 42n may be configured to be detachable from the vacuum chambers 100, 100b, 100m. For example, a sintered insulator having protrusions is prepared. Recesses may be provided in the first peripheral edge portions 111, 111m and the second peripheral edge portions 121, 121m so that the protrusions of the insulator can be fitted therein. Accordingly, the portions of the workpiece W facing the first peripheral edge portions 111, 111m and the second peripheral edge portions 121, 121m may be covered with the insulating layers. The side portions 112, 122 may also be provided with recesses in which the protrusions of the insulator can be fitted. Spiral holes for fixing may be provided in the insulator, the first peripheral edge portions 111, 111m, and the second peripheral edge portions 121, 121m so that the sintered insulator, the first peripheral edge portions 111, 111m, and the second peripheral edge portions 121, 121m are fixed to the insulating spiral holes. Similarly, spiral holes for fixing may be provided in the insulator and the side portions 112, 122 so that the sintered insulator and the side portions 112, 122 are fixed to the insulating spiral holes.

According to the above description, even in a case where foreign matter or the like generated during the plasma processing adheres to the surface of the insulating layer, the insulating layer can be detached from the vacuum chambers 100, 100b, 100m to be replaced and cleaned. Therefore, the occurrence of abnormal discharge due to the deposition of foreign matter on the surface of the insulating layer can be suppressed.

In a case where the insulating layers 41a, 42a of the second embodiment are configured to be detachable from the vacuum chamber 100, the insulating layer covering the first peripheral edge portion 111 and the insulating layer covering the side portion 112 may not be integrally configured, and the insulating layer covering the first peripheral edge portion 111 and the insulating layer covering the side portion 112 may be separable from each other. Similarly, the insulating layer covering the second peripheral edge portion 121 and the insulating layer covering the side portion 122 may not be integrally configured, and the insulating layer covering the second peripheral edge portion 121 and the insulating layer covering the side portion 122 may be separable from each other.

Other Embodiments

In the first to fourth embodiments described above, the insulating layers 41, 41b may be formed at portions of the first peripheral edge portions 111, 111m facing the workpiece W and may not be formed at portions facing the insulating members 30, 30b. Similarly, the insulating layer 42 may be formed at portions of the second peripheral edge portions 121, 121m facing the workpiece W, and may not be formed at portions facing the insulating member 30 or the pallet 130. Even in the case described above, the occurrence of abnormal discharge between the workpiece W and the first peripheral edge portions 111, 111m can be suppressed while plasma processing is performed on the workpiece W by applying a voltage between the workpiece W and the vacuum chambers 100, 100m. The occurrence of abnormal discharge between the workpiece W and the second peripheral edge portions 121, 121m can be suppressed.

In the embodiments described above, the vacuum chambers 100, 100b, 100m, and the pallet 130 are at the earth potential, but the vacuum chambers 100, 100b, 100m, and the pallet 130 may not be at the earth potential. The voltage application unit 70 may need to apply a voltage for plasma processing of the workpiece W between the vacuum chambers 100, 100b, 100m and the workpiece W, and depending on the source gas, a positive (plus) voltage may be applied between the workpiece W and the vacuum chamber 100.

In the embodiments described above, the processing objects 10, 10n are not limited to separators, and may be other conductive members such as current collecting plates used for a fuel cell. The plasma processing apparatuses 200, 200a, 200b, 200m, 200n may form a different type of thin film from the carbon-based thin film on the workpiece W, and for example, may form a thin film of a metal element such as gold, platinum, or tantalum. The plasma processing apparatuses 200, 200a, 200b, 200m, 200n may perform etching on the workpiece W, for example, using argon gas or chlorine gas.

In the embodiments described above, the first recessed portions 114, 114m and the second recessed portions 124, 124m may not be divided into the side portions and the bottom portions. For example, the first recessed portions 114, 114m and the second recessed portions 124, 124m may be hemispherical. In the case described above, a portion of the recessed portion which is connected to the peripheral edge portion and the periphery thereof may be continuously covered with the insulating layer.

The disclosure is not limited to the embodiments and modification examples described above and can be embodied by various configurations without departing from the gist of the disclosure. For example, the technical features in the embodiments and modification examples corresponding to the technical features in each of the aspects described in "SUMMARY" can be appropriately replaced or combined. Elements other than the elements described in the independent claims among the constituent elements in the embodiments and each of the modification examples described above are additional elements and can be appropriately omitted.

What is claimed is:

1. A plasma processing apparatus configured to perform plasma processing on a conductive work piece having a flat plate shape, the plasma processing apparatus comprising:
   a conductive vacuum chamber having a first recessed portion and a first peripheral edge portion provided outside the first recessed portion to be continuous with the first recessed portion, and a second recessed portion and a second peripheral edge portion provided outside the second recessed portion to be continuous with the second recessed portion, the first and second recessed portions being configured to cause a processing object portion of at least one side of the work piece having a flat plate shape to be disposed in the first and second recessed portions;
   a pallet configured to hold the work piece through a conductive masking member to be separated and insulated from the peripheral edge portion;
   a voltage supply device configured to apply a voltage between the work piece and the vacuum chamber through the conductive masking member;
   an insulating member disposed between a first peripheral edge portion and a second peripheral edge portion, and is in contact with the work piece through the conductive masking member to hold the work piece so that infiltration of the plasma from the first recessed portion or the second recessed portion into a space formed by the work piece and the first peripheral edge portion is suppressed; and
   an insulating layer configured to cover a portion of the peripheral edge portion facing the work piece.

2. The plasma processing apparatus according to claim 1, wherein:
   the recessed portion includes a bottom portion and a side portion which connects the bottom portion to the peripheral edge portion; and
   the insulating layer is configured to cover the side portion in addition to the portion of the peripheral edge portion facing the workpiece.

3. The plasma processing apparatus according to claim 1, wherein the insulating layer is configured to be detachable from the vacuum chamber.

4. The plasma processing apparatus according to claim 1, wherein the first recessed portion is provided corresponding to a front side of the workpiece, and the second recessed portion is provided corresponding to a rear side of the workpiece.

5. The plasma processing apparatus according to claim 1, wherein
   a masking member that covers a non-processing object portion of the processing object.

6. The plasma processing apparatus according to claim 1, wherein the insulating member is different from the insulating layer.

7. The plasma processing apparatus according to claim 1, wherein the insulating layer is configured to cover all portions of the peripheral edge portion facing the workpiece.

* * * * *